United States Patent [19]

Kishino et al.

[11] 4,216,470
[45] Aug. 5, 1980

[54] LUMINESCENT DISPLAY DEVICE HAVING CONDUCTORS FOR FIELD CONTROL

[75] Inventors: Takao Kishino; Nobuo Yamaguchi; Yoichi Mera, all of Mobara, Japan

[73] Assignee: Futaba Denshi Kogyo K. K., Chiba, Japan

[21] Appl. No.: 886,894

[22] Filed: Mar. 15, 1978

[30] Foreign Application Priority Data

Mar. 15, 1977 [JP] Japan .................. 52-30421

[51] Int. Cl.² .............................................. G06F 3/14
[52] U.S. Cl. ............................... 340/753; 340/713; 340/759; 340/774; 313/496; 313/519
[58] Field of Search ............... 313/495, 496, 497, 513, 313/519, 510; 340/343, 324 R, 166 EL, 753, 754, 758, 759, 772, 773, 774, 775, 811, 713; 315/168, 169.1

[56] References Cited

U.S. PATENT DOCUMENTS

| 3,800,178 | 3/1974 | Farina | 313/519 |
|---|---|---|---|
| 3,936,697 | 2/1976 | Scott | 313/495 |
| 4,100,455 | 7/1978 | DuBois | 313/496 |

FOREIGN PATENT DOCUMENTS 43-1637170  6/1968  Japan ........................ 313/497

*Primary Examiner*—Marshall M. Curtis
*Attorney, Agent, or Firm*—Oblon, Fisher, Spivak, McClelland & Maier

[57] ABSTRACT

A luminescent display device for analog display having segment anodes provided linearly on a substrate and each coated with a luminescent material layer, the segment anodes being selectively given an anode voltage according to information inputted, a filament provided above the segment anodes for emitting thermions when heated, the thermions selectively impinging on the segment anodes so as to make them emit light, and conductors each provided above and opposite to a gap existing between every two adjacent segment anodes, the conductors being kept positive with respect to the filament. The conductors provide a control for the anode field which prevents the "shade" phenomenon from occurring on the anodes.

3 Claims, 4 Drawing Figures

LUMINESCENT DISPLAY DEVICE HAVING CONDUCTORS FOR FIELD CONTROL

BACKGROUND OF THE INVENTION

1. Field of the Invention

The present invention relates to a luminescent display device for giving a luminescent analog display of information inputted.

2. Description of the Prior Art

As is well known, the methods of displaying the results of various measurements, data processing and the like are usually divided into two types, namely digital and analog. When it is desired, for instance, to make a comparison of various quantities displayed or to obtain the ratios or changes of these quantities with respect to the whole, it is more advantageous to use the analog method than to use the digital one.

Meanwhile, with the recent startling progress of electronics, electronic or electro-optical display devices using light-emitting diodes, liquid crystals and the like have been put into practical use, being used as analog display devices in replacement of those of the conventional mechanical type.

Luminescent display devices, which are included among these electronic or electro-optical display devices, have advantages in that they are excellent in luminous color, capable of being driven at low voltage, low in power consumption, low in production cost, and so on. Therefore, it is expected that these luminescent display devices will find use as the above-mentioned analog display devices.

Luminescent display devices for analog display are usually driven either by the dynamic method or by the static method. The construction of the luminescent display device adapted to be driven by the static method is shown in FIG. 1 by way of example. The features, operation, advantages and disadvantages of the prior art will be hereinafter described with reference to FIG. 1 together with FIG. 2 which shows the behavior of the display given by the conventional luminescent display device.

In FIG. 1, reference numeral 1 designates a substrate on which a plurality of segment anodes $2(2_1, 2_2, \ldots, 2_n)$ each coated with a luminescent material layer are arranged either rectilinearly or curvilinearly. The segment anodes 2 are coupled to connecting terminals $3(3_1, 3_2, \ldots, 3_n)$, respectively. A filament-shaped cathode 4 (hereinafter referred to as filament) is provided above the segment anodes 2, emitting thermions when heated. A front bulb (not shown) is bonded to the substrate 1 along the peripheries thereof to form a casing so that the inside of the casing may be kept at high vacuum and the connecting terminals 3 of the segment anodes 3 and those (not shown) of the filament 4 may be airtightly extended through the front bulb.

With the above-mentioned construction, the conventional luminescent display device is operated as follows:

First, the filament 4 is energized while the segment anodes 2 are selectively given an anode voltage through the connecting terminals 3 according to the input information to be displayed. Thus, thermions emitted from the filament 4 are made to impinge on the segment anodes 2 to which the anode voltage has been given, and thereby a bar-shaped luminescent display is obtained the length of which corresponds to the above-mentioned input information.

In the foregoing display device shown in FIG. 1, the segment anodes 2 to which the anode voltage is not given are adapted to be given a potential equal to or lower than that of the filament 4 so as to prevent leakage emission.

Therefore, if the segment anodes $2_1$, $2_2$ and $2_3$ are given an anode voltage while those $2_4$ to $2_n$ are kept negative with respect to the filament 4 as shown in FIG. 2 for instance, the path of the thermions impinging on the segment anode $2_3$ positioned at the boundary of the light-emitting region tend to bend by the action of a negative field formed by the segment anode $2_4$ with no light emission, and as a result an area S on which thermions do not impinge is created on the periphery of the segment anode $2_3$.

In other words, the electric field is disturbed in the vicinity of the above-mentioned boundary of the light-emitting region and as a result an area S where light is not emitted is formed on the segment anode 2 which is expected to emit light. Thus, the area S becomes a defect of display, or a so-called "shade" which makes the luminescent display unclear. Moreover, if the segment anodes 2 are strip-shaped and arranged at right angles to the filament 4, the segment anode positioned at the boundary of the light-emitting region does not emit light thereby causing a read error.

For the purpose of preventing the above-mentioned "shade", there has been proposed a display device in which a control grid in the form of, for instance, a net is provided between the filament 4 and the segment anode 2, being made positive with respect to the control grid to correct the disturbance of the electric field caused by the segment anode 2 which does not emit light so that thermions emitted from the filament 4 may impinge uniformly on the segment anodes 2 to which the anode voltage is applied.

In such a display device, however, the control grid provided between the filament 4 and the segment anode 2 prevents clear observation of the segment anode 2 which is emitting light, being expensive and complicated in construction. Therefore, such a conventional display device has problems in terms of performance, price and production.

BRIEF SUMMARY OF THE INVENTION

The present invention contemplates to eliminate the aforementioned disadvantages of the prior art.

Therefore, it is the main object of the present invention to provide a luminescent display device for analog display which can prevent the occurrence of the so-called "shade" at the boundary of the light-emitting region, can give very clear and correct display, and can be made simple in construction, low in production cost, and simple in assembly operation.

According to the present invention, there is provided a luminescent display device for analog display in which a conductor is provided above and opposite to each gap existing between every two adjacent segment anodes so as not to prevent clear observation of the segment anodes which are emitting light, being made positive with respect to a filament provided above the conductor.

DETAILED DESCRIPTION OF THE PREFERRED EMBODIMENTS

Now, the present invention will be hereinafter described with reference to FIGS. 3 and 4.

Figure 1:
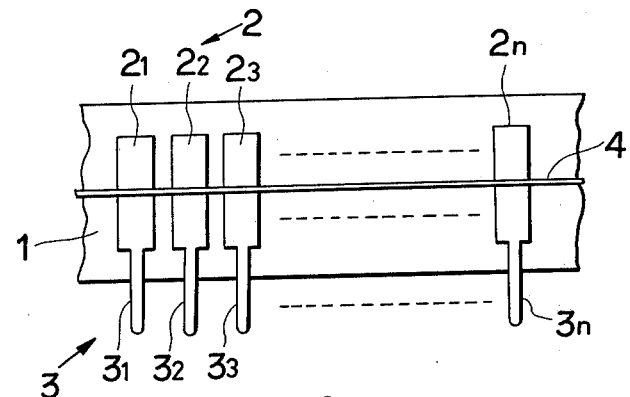
FIG. 1 is a fragmentary plane view of a conventional luminescent display device for analog display showing the essential part thereof.
Figure 2:
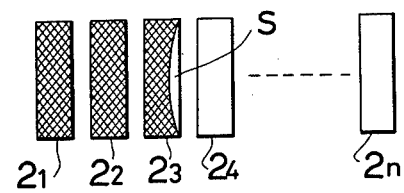
FIG. 2 shows an example of the behavior of a luminescent analog display given by the conventional display device such as shown in FIG. 1
Figure 3:
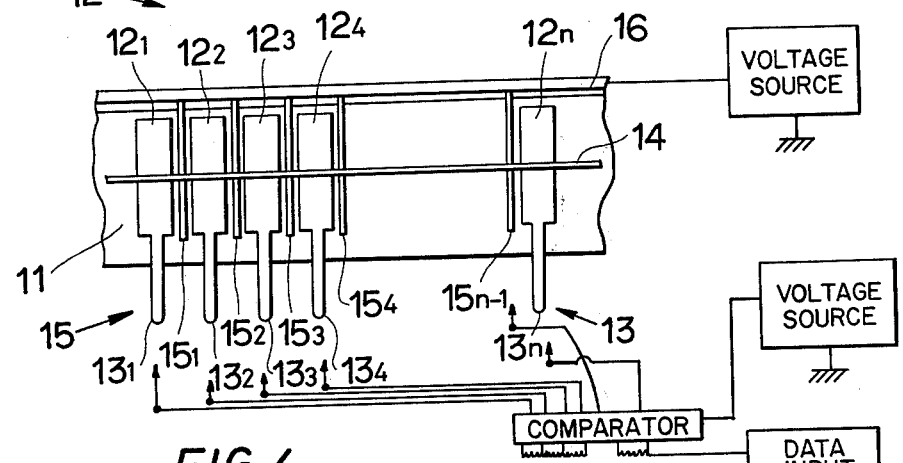
FIG. 3 is a fragmentary plane view of a luminescent display device according to a preferred embodiment of the present invention showing the essential part thereof.

In FIG. 3, reference numeral 11 designates a substrate made of ceramics, glass or the like on which a plurality of segment anodes 12 ($12_1$, $12_2$, $12_3$, . . . , $12_n$) are arranged at predetermined intervals. The segment anodes 12, each of which is coated with a luminescent material layer, are electrically coupled to a voltage source through connecting terminals 13 ($13_1$, $13_2$, . . . , $13_n$), respectively. Reference numeral 14 designates a filament common to the segment anodes 12 and provided thereabove for emitting thermions when heated.

Reference numerals 15 ($15_1$, $15_2$, . . . , $15_{n-1}$) designate conductors in the form of, for instance, thin metal wires or strips each provided above and opposite to a gap existing between every two adjacent segment anodes 12. These conductors 15 are electrically connected in common with one another through a conductive layer 16 formed, for instance, on the periphery of the substrate 11, being at all times kept positive with respect to the filament 14, for instance, being given an anode voltage by a voltage source.

Moreover, a front bulb (not shown) transparent at least at its front portion is bonded to the substrate 11 along the peripheries thereof to form a casing so that the inside of the casing may be kept at high vacuum and the connecting terminals 13 of the segment anodes 12 and those (not shown) of the filament 14 may be airtightly extended through the front bulb.

With the above-mentioned construction, the luminescent display device according to the present invention may be operated as follows:

The anode segments 12 are selectively given an anode voltage through the connecting terminals 13 respectively, by well known circuitry according to the input information to be displayed, while the filament 14 is energized and heated.

Thus, the thermions emitted from the filament 14 impinge on the segment anodes 12 to which the anode voltage is applied. In this manner, the segment anodes 12 are driven to emit light thereby giving a luminescent analog display the length of which corresponds to the input information.

Figure 4:
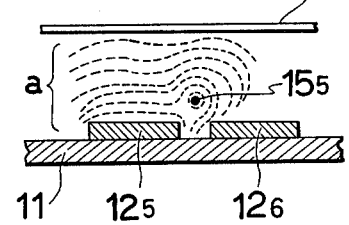
FIG. 4 is a fragmentary sectional drawing of the device shown in FIG. 3 for explaining the operation thereof.

In this state, the potential distribution at the boundary of the light-emitting region may be expressed as shown in FIG. 4. If, for instance, the segment anodes $12_1$ to $12_5$ are given an anode voltage so that they may be driven and emit light and in addition the segment anodes $12_6$ to $12_n$ are given a voltage equal to or lower than that of the filament 14, equipotential lines "a" in the vicinity of the boundary of the light-emitting region influenced by the positive potential given at all times to the conductor $15_5$ may be plotted as shown in FIG. 4.

More particularly, a negative field formed by the segment anode $12_6$ kept at a negative potential reduces its influence on the segment anode $12_5$ by the action of the conductor $15_5$ to which the above-mentioned positive potential is given. As a result, an almost uniform positive field is formed in the vicinity of the surface of the segment anode $12_5$.

Accordingly, thermions emitted from the filament 14 are made to impinge almost uniformly on the surface of the segment anode $12_5$. Thus the segment anode $12_5$ is driven and made to emit light almost uniformly. Therefore, the device according to the present invention can give a clear and correct luminescent analog display without producing the so-called "shade" even at the boundary of the light-emitting region.

It will be understood from the foregoing description that the luminescent display device for giving an analog display of input information according to the present invention has the following various features, effects and advantages:

The device of the present invention has segment anodes arranged either rectilinearly or curvilinearly and each coated with a luminescent material layer, and conductors each provided above and opposite to a gap existing between every two adjacent segment anodes and kept at all times positive with respect to a filament disposed above the conductors. Therefore, the positive electric field produced by these conductors can reduce the influence of the negative electric field produced by the segment anodes which are not emitting light.

Accordingly, the device of the present invention can give a very clear and correct luminescent analog display because the occurence of the so-called "shade" is eliminated even at the boundary of the light-emitting region.

In addition, the conductors are formed of thin metal wires, strips or the like, and therefore they do not prevent observation of the segment anodes which are emitting light, contributing to obtaining an excellent luminescent display.

Furthermore, the conductors are much more inexpensive than the conventional mesh-shaped control grids or the like, being very easy to install. Thus, the device of the present invention can produce great effects in terms of cost and production.

Obviously many modifications and variations of the present invention are possible in the light of the above teachings. It is therefore to be understood that within the scope of the appended claims the invention may be practiced otherwise as specifically described herein.

What is claimed as new and desired to be secured by Letters Patent of the United States is:

1. In a luminescent display device for providing an analog display of input information, said device having a plurality of segment anodes provided linearly on a substrate and each coated with a luminescent material layer, said segment anodes being selectively given an anode voltage according to said input information by voltage means connected to said segment anodes, and a filament-shaped cathode provided above said segment anodes for emitting thermions when heated, said thermions emitted from said cathode being adapted to selectively impinge on said segment anodes so as to make them emit light, an improvement comprising a conductor provided above the gap existing between every two adjacent segment anodes, each said conductor being kept positive with respect to said filament-shaped cathode by a voltage means connected to each said conductor.

2. A luminescent display device as in claim 1, wherein said conductors are formed of thin metal wires.

3. A luminescent display device as in claim 1, wherein said conductors are formed of thin metal strips.

* * * * *